US010236239B2

(12) United States Patent
Perkins (10) Patent No.: US 10,236,239 B2
(45) Date of Patent: Mar. 19, 2019

(54) APPARATUS AND SEMICONDUCTOR STRUCTURE INCLUDING A MULTILAYER PACKAGE SUBSTRATE

(71) Applicant: Avago Technologies General IP (Singapore) Pte. Ltd., Singapore (SG)

(72) Inventor: Nathan Perkins, Windsor, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 17 days.

(21) Appl. No.: 14/608,809

(22) Filed: Jan. 29, 2015

(65) Prior Publication Data

US 2016/0225689 A1    Aug. 4, 2016

(51) Int. Cl.
| | | |
|---|---|---|
| *H01L 23/367* | (2006.01) | |
| *H01L 23/498* | (2006.01) | |
| *H01L 23/14* | (2006.01) | |
| *H01L 23/15* | (2006.01) | |
| *H01L 23/36* | (2006.01) | |
| *H01L 23/48* | (2006.01) | |

(52) U.S. Cl.
CPC ...... *H01L 23/49811* (2013.01); *H01L 23/145* (2013.01); *H01L 23/15* (2013.01); *H01L 23/36* (2013.01); *H01L 23/3677* (2013.01); *H01L 23/481* (2013.01); *H01L 2224/0603* (2013.01); *H01L 2224/14* (2013.01); *H01L 2224/48463* (2013.01); *H01L 2224/4911* (2013.01); *H01L 2224/73257* (2013.01); *H01L 2924/00014* (2013.01)

(58) Field of Classification Search
CPC ....... H01L 23/481; H01L 23/66; H01L 23/53; H01L 23/7371; H01L 23/49811; H01L 23/145; H01L 23/15; H01L 23/36; H01L 23/3677; H01L 2224/0603; H01L 2224/14; H01L 2224/48463; H01L 2224/4911; H01L 2224/73257; H01L 2924/00014
USPC ......................................................... 257/712
See application file for complete search history.

(56) References Cited

U.S. PATENT DOCUMENTS

| | | | |
|---|---|---|---|
| 5,710,068 A * | 1/1998 | Hill ....................... | H01L 23/481 |
| | | | 257/E23.011 |
| 7,026,664 B2 | 4/2006 | Divakar et al. | |
| 8,680,404 B2 | 3/2014 | Ryoichi et al. | |
| 2009/0179324 A1* | 7/2009 | Chen .................. | H01L 23/3677 |
| | | | 257/713 |
| 2012/0025269 A1 | 2/2012 | Parkhurst et al. | |
| 2012/0025370 A1 | 2/2012 | Wholey et al. | |

(Continued)

FOREIGN PATENT DOCUMENTS

GB         2325082 A       11/1998

*Primary Examiner* — Cuong Q Nguyen
*Assistant Examiner* — Tong-Ho Kim (57) ABSTRACT

An apparatus includes a multilayer package substrate having a plurality of layers. The apparatus also includes a first heat sink disposed over the package substrate. The first heat sink is configured to connect to a semiconductor device and to provide an electrical ground for the semiconductor device. The apparatus includes a second heat sink disposed in the package substrate. The first heat sink overlaps substantially all of the first electrically conductive layer and no dielectric material exists in the multilayer package substrate in a region of contact of the first heat sink and the first electrically conductive layer.

24 Claims, 4 Drawing Sheets

(56) References Cited

U.S. PATENT DOCUMENTS

2012/0049345 A1  3/2012  Railkar et al.
2013/0134560 A1  5/2013  Wholey et al.

* cited by examiner

APPARATUS AND SEMICONDUCTOR STRUCTURE INCLUDING A MULTILAYER PACKAGE SUBSTRATE

BACKGROUND

Heat dissipation is becoming an increasingly important issue for mobile power amplifiers. The requirement for better thermal conduction is partly due to shrinking power amplifier die and package sizes, which increases the demands simply by increasing the thermal densities. In addition, modern mobile amplifiers typically operate at higher data rates, and closer to peak output powers on average. Moreover, the increased multi-band capabilities of modern mobile amplifier modules generally means that the amplifier must overcome greater series insertion loss to the antenna (in the form of increased, switch and filter content), which also increases the power demand on the amplifier.

The thermal resistances of materials m a structure impact the ability to dissipate heat. According to a known amplifier structure, minimum values for thermal resistance are obtained when the power amplifier die thickness is minimized, or when the output area occupied by the power transistor is increased. Both of these factors are undesirable from a practical point of view. For example, minimizing the power amplifier die thickness increases yield loss problems associated with thin wafer handling and breakage, and also increases yield loss problems associated with thin die pick and place in packaging. Also, increasing the output area occupied by the power transistor increases the overall power amplifier die area, which consequently increases the cost of the power amplifier die and the overall package size. In practice, lower cost power amplifier die and smaller overall package sizes are highly desirable.

What is needed, therefore, is an apparatus that overcomes at least the shortcomings described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom" "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or inure layers, materials, structures, etc., between the elements.

As described more fully below in accordance with a representative embodiment, an apparatus comprises a package substrate, which comprises a plurality of layers. The apparatus further comprises a first beat sink disposed over the package substrate. The first heat sink is configured to connect to a semiconductor device and to provide an electrical ground for the semiconductor device. The apparatus further comprises a second heat sink disposed in the package substrate. The second heat sink comprises a first electrically conductive layer disposed in a first layer, a second electrically conductive layer disposed in a third layer, and a via disposed in a second layer. The via electrically connects the first electrically conductive layer and the second electrically conductive layer. The first heat sink overlaps substantially all of the first electrically conductive layer and no dielectric material exists in the multilayer package substrate in a region of contact of the first heat sink and the first electrically conductive layer. Stated somewhat differently, the first heat sink overlaps substantially all of the first electrically conductive layer with only the first electrically conductive layer disposed in the multilayer package substrate in a region of contact of the first heat sink and the first electrically conductive layer.

In accordance with another representative embodiment, a semiconductor structure comprises a semiconductor substrate comprising a first side and a second side; and a semiconductor device disposed over the second side of the semiconductor substrate. The semiconductor structure further comprises a multilayer package substrate comprising a plurality of layers; and a first heat sink disposed over the package substrate. The first heat sink is configured to connect to a semiconductor device and to provide an electrical ground for the semiconductor device. The semiconductor structure further comprises a second heal sink disposed in the package substrate. The second heat sink comprises a first electrically conductive layer disposed in a first layer, a second electrically conductive layer disposed in a third layer, and a via disposed in a second layer. The via electrically connects the first electrically conductive layer and the second electrically conductive layer. The first heat sink overlaps substantially all of the first electrically conductive layer with only the first electrically conductive layer disposed in the multilayer package substrate in a region of contact of the second heat sink and the first electrically conductive layer. Stated somewhat differently, no dielectric material exists in the multilayer package substrate in a region of contact of the second heat sink and the first electrically conductive layer.

Figure 1:
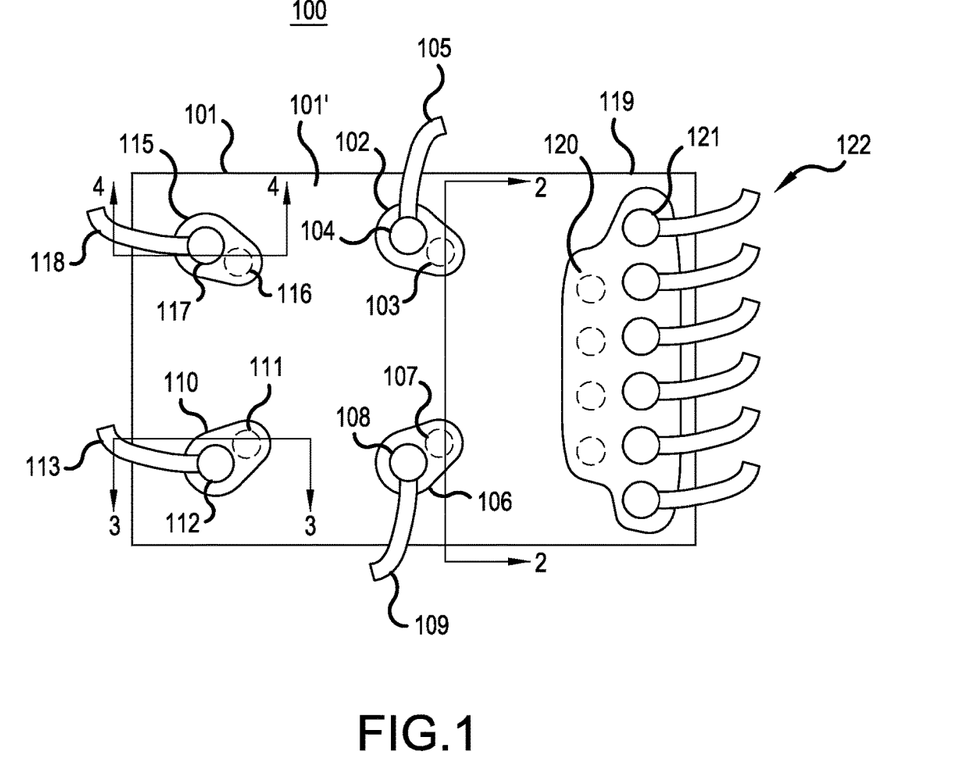
FIG. 1 shows a top view of a semiconductor structure in accordance with a representative embodiment.

FIG. 1 shows a top view of a semiconductor structure 100 in accordance with a representative embodiment. The semiconductor structure 100 comprises a semiconductor die substrate ("die substrate") 101. As described more fully below, the semiconductor die substrate 101 is disposed over a multi-layer board (MLB), which may be referred to as a package substrate.

On a first side 101' of the semiconductor the substrate 101, a first metalized via 102 comprises a first through-via 103 and a first wirebond pad 104. As described more fully below, the first through-via 103 comprises an electrically conductive layer or is substantially filled with an electrically conductive material, and extends to a second side (not shown in FIG. 1) of the semiconductor die substrate 101 opposing the first side 101', allowing for electrical signals control signals) to be provided to a semiconductor device (not shown in FIG. 1) from a first wirebond 105 that is electrically connected to the first wirebond pad 104.

Also disposed on the first side 101', is a second metalized via 106. The second metallized via 106 comprises a second through-via 107 and a second wirebond pad 108. Like the first through-via 103, the second through-via 107 comprises an electrically conductive layer or is substantially filled with an electrically conductive material, and extends to a second side not shown in FIG. 1) of the semiconductor die substrate 101 opposing the first side 101', allowing for electrical signals (e.g., low power RF output signals) to be received from another semiconductor device (not shown in FIG. 1) from a second wirebond 109 that is electrically connected to the second wirebond pad 108.

Also disposed on the first side 101', is a third metalized via 110. The third metalized via 110 comprises a third through-via 111 and a third wirebond pad 112. Like the first through-via 103, the third through-via 111 comprises an electrically conductive layer or is substantially filled with an electrically conductive material, and extends to a second side (not shown in FIG. 1) of the semiconductor die substrate 101 opposing the first side 101', allowing for electrical signals (e.g., RF input signals) to be provided to yet another semiconductor device (not shown in FIG. 1) from a third wirebond 113 that is electrically connected to the third wirebond pad 112.

Also disposed on the first side 101', is a fourth metalized via 115. The fourth metalized via 115 comprises a fourth through-via 116 and a fourth wirebond pad 117. Like the first through-via 103, the fourth through-via 116 comprises an electrically conductive layer or is substantially filled with an electrically conductive material, and extends to a second side (not shown in FIG. 1) of the semiconductor die substrate 101 opposing the first side 101', allowing for electrical signals (e.g., DC power signals) to be provided to yet another semiconductor device (not shown in FIG. 1) from a fourth wirebond 118 that is electrically connected to the fourth wirebond pad 115.

Finally, a fifth wirebond pad 119 is disposed on the first side 101' of the semiconductor die substrate 101. The fifth wirebond pad 119 comprises a plurality of lift through-vias 120 and a plurality of fifth wirebond pads 121, with one of a plurality of fifth wirebonds 122 electrically connected to each of the fifth wirebond pads 121. Like the first through-via 103, each of the plurality of fifth through-vias 120 comprises an electrically conductive layer or is substantially filled with an electrically conductive material, and extends to a second side (not shown in FIG. 1) of the semiconductor die substrate 101 opposing the first side 101', allowing for electrical signals (e.g., high power RF output signals) to be received from one of a plurality of semiconductor devices (not shown) from each of the plurality of fifth wirebonds 122 that is electrically connected to one of the fifth wirebond pads 121.

It is noted that the number and arrangement of metalized vias, through vias, wirebond pads and wirebonds described above in connection with a representative embodiment is merely illustrative, and not intended to be in any way limiting. Rather, more or fewer metalized vias, through vias, wirebond pads and wirebonds and electrical arrangements thereof are contemplated by the present teachings. However, and as will become clearer as the present description continues, the connections to the first side 101' of the semiconductor die substrate 101 are generally other than electrical ground connections, and the connections to the first side 101 of the semiconductor die substrate 101 are not used for thermal grounding (i.e., as main paths for heat dissipation). Rather, and as will become clearer as the present description continues, electrical and thermal grounding of the semiconductor structure 100 is effected at the side of the semiconductor die substrate 101 opposing the first side 101'.

Figure 2:
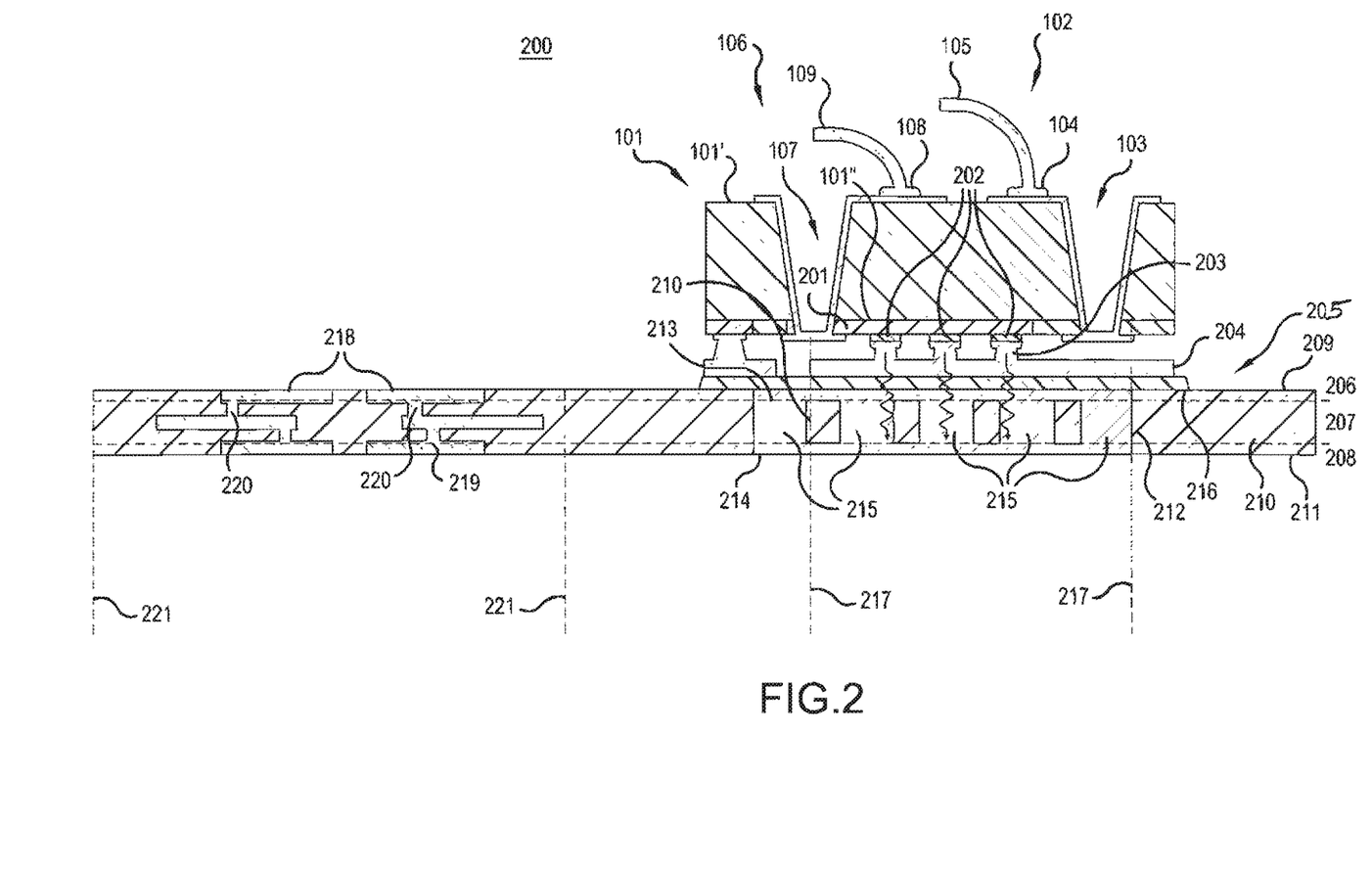
FIG. 2 shows a cross-sectional view of a portion of the semiconductor structure depicted in FIG. 1.

FIG. 2 shows a cross-sectional view taken along line 2-2 of a portion 200 of the semiconductor structure 100 depicted in FIG. 1. The portion 200 of the semiconductor structure 100 comprises the first and second metalized vias 102, 106, respectively.

The semiconductor die substrate 101 comprises an active semiconductor region 201 disposed over a second side 101", which opposes the first side 101' of the semiconductor die substrate 101. A plurality of active semiconductor devices 202 are provided over the active semiconductor region 201, and illustratively comprise power transistors, such as may be contemplated for use in power amplifiers. The semiconductor die substrate 101 illustratively comprises semiconductor materials used for the active semiconductor device include binary semiconductor materials including Group III-IV semiconductor materials (e.g., GaAs, InP, AlAs, GaN, AlN, InN) and Group IV-VI semiconductor materials, ternary semiconductor materials, silicon (Si), silicon-germanium (SiGe), and alloys of some of these semiconductor materials.

Illustratively, the power transistors and power amplifiers comprising the active semiconductor devices 202 are contemplated for use in radio frequency (RF), microwave and millimeter wave applications. In accordance with certain representative embodiments, the active semiconductor devices 202 of the semiconductor die substrate 101 are heterojunction bipolar transistors (HBTs). Alternatively, the active devices may be pseudomorphic high electron mobility transistors (pHEMTs). HEMTs, metal-semiconductor field effect transistors (MESFETs), or other junction gate field effect transistors (JFETs) known to those of ordinary skill in the art. Still alternatively, the semiconductor material may comprise silicon and the active device may comprise a metal oxide semiconductor (MOS) device such as a MOS field effect transistor (MOSFET) or complementary MOS (CMOS) device. Essentially, and as will become clearer as the present description continues, the present teachings are contemplated for use when it is useful to remove heat from the semiconductor structure 100, as well as to reduce susceptibility of the semiconductor structure to stress and strain cause by mismatches in the coefficient of thermal expansion of the various materials used in the semiconductor structure 100. As such, and more generally, the present teachings are applicable more broadly to a variety of electronic and optoelectronic applications.

In a representative embodiment, each of the active semiconductor devices 202 is connected to a respective pedestal 203. Each pedestal 203 is disposed over a heat sink 204 (referred to below as a first heat sink 204). In this way, the active semiconductor devices 202 are flip-chip mounted over the heat sink 204.

The heat sink 204 is disposed over a multilayer package substrate 205 that comprises a first layer 206, a second layer 207 and a third layer 208. Notably, the boundaries of the first layer 206, the second layer 207 and the third layer 208 are distinguished in the drawings with a dashed-line, such as shown in FIG. 2. As described herein, each of the first, second and third layers 206~208 may comprise a dielectric layer, electrical elements, or both. Certain aspects of the multilayer package substrate 205 or components thereof may be found in commonly owned U.S. Patent Application Publication 20120049345 to Railkar, et al. and entitled "Substrate Vias for Heat Removal from Semiconductor Die." The entire disclosure of U.S. Patent Application Publication 20120049345 is specifically incorporated herein by reference in its entirety.

First layer 206 comprises a first dielectric layer 209; second layer 207 comprises a second dielectric layer 210; and third layer 208 comprises a third dielectric layer 211. Notably, each of the first~third dielectric layers 209-211 may comprise more than one dielectric layer. Moreover, the depicted three layers (i.e., first layer 206, second layer 207 and third layer 208) are merely illustrative. Generally, the multilayer package substrate 205 may comprise more than three layers, and the constituent components of each layer described herein. Illustratively, the multilayer package substrate 205 comprises seven (7) to nine (9) layers, again with each layer comprising the constituent components described in connection with first layer 206, second layer 207 and third layer 208 herein. Furthermore, each of the first~third layers 206-208 may comprise a plurality of sub-layers.

The first~third dielectric layers 209-211 comprise a dielectric material or as ceramic material. Generally, although not necessarily, the first~third dielectric layers 209-211 (and any constituent layers thereof) are made of the same material. Illustrative materials include, but are not limited to, a composite epoxy material comprising lateral fibers, prepreg, teflon, aluminum oxide, ceramic or glass materials. Depending on the application, a wide range of ceramic materials are also contemplated. Some examples include aluminum nitride, aluminum silicate, barium neodymium titanate, barium strontium titanate (BST), barium tantalate, barium titanate (BT), beryllia boron nitride, calcium titanate, calcium magnesium titanate (CMT), magnesium aluminum silicate, lead zinc niobate (PZN), lithium niobate (LN), magnesium silicate, magnesium titanate, niobium oxide, porcelain, quartz, sapphire, strontium titanate, silica, tantalum oxide, and zirconium oxide.

Generally, the electrical elements (described more fully below) are electrical circuits configured to provide electrical power, electrical signals, and ground between passive components and active components (e.g., active semiconductor devices 202) disposed over the multilayer package substrate 205. Moreover, the electrical elements provided in the multilayer package substrate 205 may also provide paths of heat dissipation for the passive and active components disposed over the multilayer package substrate 205.

A second heat sink 212 is disposed in the multilayer package substrate 205. The second heat sink 212 comprises a first electrically conductive layer 213 disposed in the first layer 206, a second electrically conductive layer 214 disposed in the third layer 208, and vias 215 disposed in the second layer 207, and connecting the first electrically conducting layer 213 to the second electrically conducting layer 214. It is noted that the second heat sink 212 may comprise more electrically conducting layers (not shown) disposed in additional layers (not shown) in the multilayer package substrate 205, with additional vias (not shown) connecting the additional electrically conducting layers. Moreover, there may be more or fewer vias 215 disposed between the first electrically conducting layer 213 and the second electrically conducting layer 214.

In accordance with a representative embodiment, the first and second electrically conductive layers 213, 214 each comprise a material selected to provide suitable thermal conductivity, while also providing electrical conductivity. In a representative embodiment, the material may be a thermal electrical conductor such as gold (Au), or copper (Cu), or silver (Ag), or aluminum (Al), or Tungsten (W) or alloys thereof. Similarly, the vias 215 may comprise these materials, and generally, are made of the same materials as the first and second electrically conductive layers 213, 214. It is emphasized that this is merely illustrative and other materials may be used for the vias 215. To this end, the vias 215 may comprise virtually any metal, and more generally any material that provides sufficiently high thermal conductivity. Finally, in certain representative embodiments, more than one material may be used for the vias 215. For example, the outer portion of the vias 215 may comprise one material (e.g., copper) that is "filled" with another material (e.g., Al) such as a damascene via structure (not shown).

Generally, an apparatus, as described herein, comprises the multilayer package substrate 205, comprising the first heat sink 204 and the second heat sink 212, with the first heat sink 204 being bonded to the second heat sink 212 using a suitable bonding material 216. By contrast, when a semiconductor die substrate (e.g., semiconductor die substrate 101) is disposed over the apparatus, the resultant structure may be referred to as a semiconductor structure.

The bonding material 216 is useful in bonding a metal or alloy layer to another layer, or a metal layer to a dielectric layer, or both. Illustratively, the bonding material 216 may be an electrically and thermally conductive material.

As depicted in FIG. 2, the first heat sink 204 contacts, and is bonded to the first electrically conductive layer 213 of the second heat sink 212 and overlaps the first electrically conductive layer 213 in a region 217 (referred to below as a first region 217). In the region 217, there are no "breaks" in electrically conductive material used to form the first electrically conductive layer 213, and thus the second dielectric layer 210 is not exposed at the upper surface of the multilayer package substrate 205. As such, the first heat sink 204 does not contact a dielectric material in the region 217 where the lint heat sink 204 contacts and overlaps the first electrically conductive layer 213. Stated somewhat differently, the first heat sink 204 overlaps substantially all of the first electrically conductive layer 213 with only the first electrically conductive layer 213 disposed in the multilayer package substrate in a region of contact of the second heat sink 212 and the first electrically conductive layer 213. As will be described more fully below, the second beat sink 212 provides an improved path of heat dissipation (represented in FIG. 2 with "squiggly" arrows), while maintaining or exceeding the mechanical stability of the resultant semiconductor structure when compared to known structures.

The multilayer package substrate 205 also comprises first electrical circuits 218 disposed in the first layer 206, and second electrical circuits 219 in third layer 208, with inter layer connections 220 selectively electrically connecting the first and second electrical circuits 218, 219. As can be appreciated, the first and second electrical circuits 218, 219 and the inter-layer connections 220 each comprise an electrically conductive material. Illustratively, the electrically conductive material may be gold (Au), or copper (Cu), or silver (Ag), or aluminum (Al), or Tungsten (W) or alloys thereof.

Notably, gaps (e.g., gaps 222) exist between the first electrical circuits 218 and at the upper surface of the multilayer package substrate 205, exposing the first dielectric layer 209 in a second region 221 of portion 200. If a heat sink would be disposed over the multilayer package substrate 205 to contact the first electrical circuits, the heat sink would be in contact with the first dielectric layer 209. These gaps 222, among other factors would be M the heat-flow path of such a heat sink and result in an increase in the thermal resistance and a decrease in the heat dissipation provided by the multilayer package substrate 205 in the second region 221 of portion 200. By contrast, and as noted above, in first region 217, no gaps or breaks exist exposing dielectric at the surface of multilayer package substrate 205, and the thermal path for heat dissipation is through the first and second heat sinks 204, 212, with little, if any dielectric material in the thermal path.

As alluded to above, the wirebonds the "backside" of the semiconductor die substrate 101 are connected to electrical circuits of the multilayer package substrate 205 to provide electrical signal and power connections to/from the various semiconductor devices of the semiconductor die substrate. Accordingly, in the presently described embodiment, the first wirebond 105 is electrically connected to an electrical circuit (at a location not shown in FIG. 2) such as the first electrical circuit 218. As noted above, the first wirebond 105 provides an RF input signal to one or more of the active semiconductor devices 202. Similarly, the second wirebond 109 is electrically connected to an electrical circuit (at a location not shown in FIG. 2) such as the first electrical circuit 218. As noted above, the second wirebond 109 provides DC power to one or more of the active semiconductor devices 202. By contrast, electrical ground to the active semiconductor devices 202 is made through the first and second heat sinks 204, 212, as described more fully below.

As noted above, it is beneficial to improve the thermal dissipation from active and passive devices in electronic and optoelectronic applications. One known arrangement to provide a comparatively improved thermal dissipation path with comparatively low thermal resistance involves coupling multiple electrical inputs and outputs from the power amplifier die coupled to a multilayer multilayer package substrate using copper bump pillars (not shown), which are then attached to the multilayer multilayer package substrate using solder die attach.

In certain known arrangements, all of the input/outputs including electrical ground, signal, and power are coupled through copper bump pillars to the multilayer package substrate. By avoiding heat transport through the electrically insulating semiconductor die substrate, this approach significantly improves the heat transport from the active power transistors. However, such an approach introduces significant practical issues with differences in the coefficient of thermal mismatch between the multilayer package substrate and the coupled copper bump pillars and the power amplifier die. In particular, the relatively large thermal expansion coefficient differences between the power amplifier die, the copper bump pillar, and the multilayer package substrate lead to transmission of stress and strain from the multilayer package substrate directly through the relatively small area copper bump pillars onto the active power transistors. In practical assemblies, the resulting stress can be sufficient to fracture the active power transistors during reliability strife cycles.

In the second region 221 there is substantially more dielectric material per unit volume of multilayer package substrate 205 than there is metal or other thermally and electrically conductive material. Because the thermal resistance of the dielectric material is substantially greater than metal or alloys used for the first and second electrical circuits 218, 219 and the inter-layer connections 220, heat dissipation through the second region 221 is poor compared to that in the first region 217, as described more fully below. By contrast, the first region 217 comprises a significantly greater mass of electrically and thermally conductive material per unit volume of the multilayer package substrate 205 than that of second region 221. Specifically, this mass of electrically and thermally conductive material comprises the second heat sink 212, and may also include the first beat sink 204 disposed thereover. According to as representative embodiment, the fraction of electrically and thermally conductive material in the multilayer package substrate 205 is in the range of greater than approximately 25% to approximately 75% in the second region 221, which is the region surrounding the active semiconductor devices 202.

Certain benefits are realized by the arrangement of the second heat sink 212 disposed in the multilayer package substrate 205, and its connection to the first heat sink 204 electrically connected thereto. Illustratively, the greater density of thermally and electrically conductive material used in the first and second heat sinks 204, 212 reduce the susceptibility to stresses and strains that can occur due to mismatch of the coefficients of thermal expansion (CITE) of materials in the first region 217. Specifically, because of the comparatively large area of overlap of the thermally and electrically conductive materials that make up the first and second heat sinks 204, 212 and in view of the comparatively small volume of other materials (e.g., first~third dielectric layers 209~211), thermal mismatch issues due to differences in the CTE of materials in the first region 217 are significantly reduced compared to known structures. In accordance with a representative embodiment, the area of overlap of the electrically and thermally conductive materials that make up the first and second heat sinks 204, 212 is approximately one-half the thickness of the multilayer package substrate 205. For purposes of illustration, the area of overlap of the electrically and thermally conductive materials that make up the first and second heat sinks 204, 212 is approximately 75 µm to approximately 150 µm or more.

As such, in part because of the comparatively large area of overlap of the thermally and electrically conductive materials that make up the first and second heat sinks 204, 212, a greater amount of force can be tolerated due to thermal mismatch, providing a greater degree of mechanical isolation of the semiconductor die substrate 101 from the multilayer package substrate 205. Moreover, because of the large portion of first region 217 that is made up of thermally and electrically conductive materials that make up the first and second heat sinks 204, 212 and in view of the comparatively small volume of other materials (e.g., first~third dielectric layers 209~211), thermal mismatch is relatively small. Beneficially, because of the mechanical isolation and significantly reduced thermal mismatch realized by the first and second heat sinks 204, 212, the first region 217 in which a significant portion of heat is generated, is less susceptible to failure due to stresses and strains that can result from these mismatches. As can be appreciated, the improved mechanical reliability directly improves the overall reliability of the semiconductor structure 100. By contrast, known discrete copper bump pillars have comparatively small areas of overlap with the substrates over which they are disposed, and do not realize substantial mechanical isolation.

Additionally, because of the comparatively large portion of first region 217 that comprises a thermally and electrically conductive material, the thermal resistance in first region 217 is comparatively low. As such, thermal dissipation of heat from the active semiconductor devices 202 is substantially improved compared to known apparatuses, such as those having a copper bump pillar. As will be appreciated by one of ordinary skill in the art, for a semiconductor structure having the same areal dimensions (i.e., footprint) as semiconductor structure 100, the junction temperatures of the active semiconductor devices 202 are reduced. Similarly, for a given desired junction temperature, the semiconductor structure 100 can be provided in a smaller overall areal dimension through a smaller areal dimension of the active semiconductor region 201 and semiconductor die substrate 101, thereby allowing a lower overall cost of the semiconductor structure 100 and a smaller areal size (footprint) of the resultant package.

In addition to the improvements in thermal characteristics of the semiconductor structure 100, certain electrical properties are beneficially improved through the components of first region 217. Notably, the first and second heat sinks 204, 212 provide an electrical ground plane fabricated from electrically conductive materials, in thermal proximity to the active semiconductor devices 202, and occupying a majority of the interfacial area between the semiconductor die substrate 101 and the multilayer package substrate 205. Furthermore, compared to known power amplifier packages, because of the comparatively large areal and volume dimensions of the first and second heat sinks 204, 212, which also function as the electrical ground for the active semiconductor devices 202, the semiconductor structure 100 provides a decrease in parasitic inductance to ground. Reducing the parasitic inductance to ground can result in an efficiency improvement, and reduced power requirements, thereby improving battery life for mobile devices.

Figure 3:
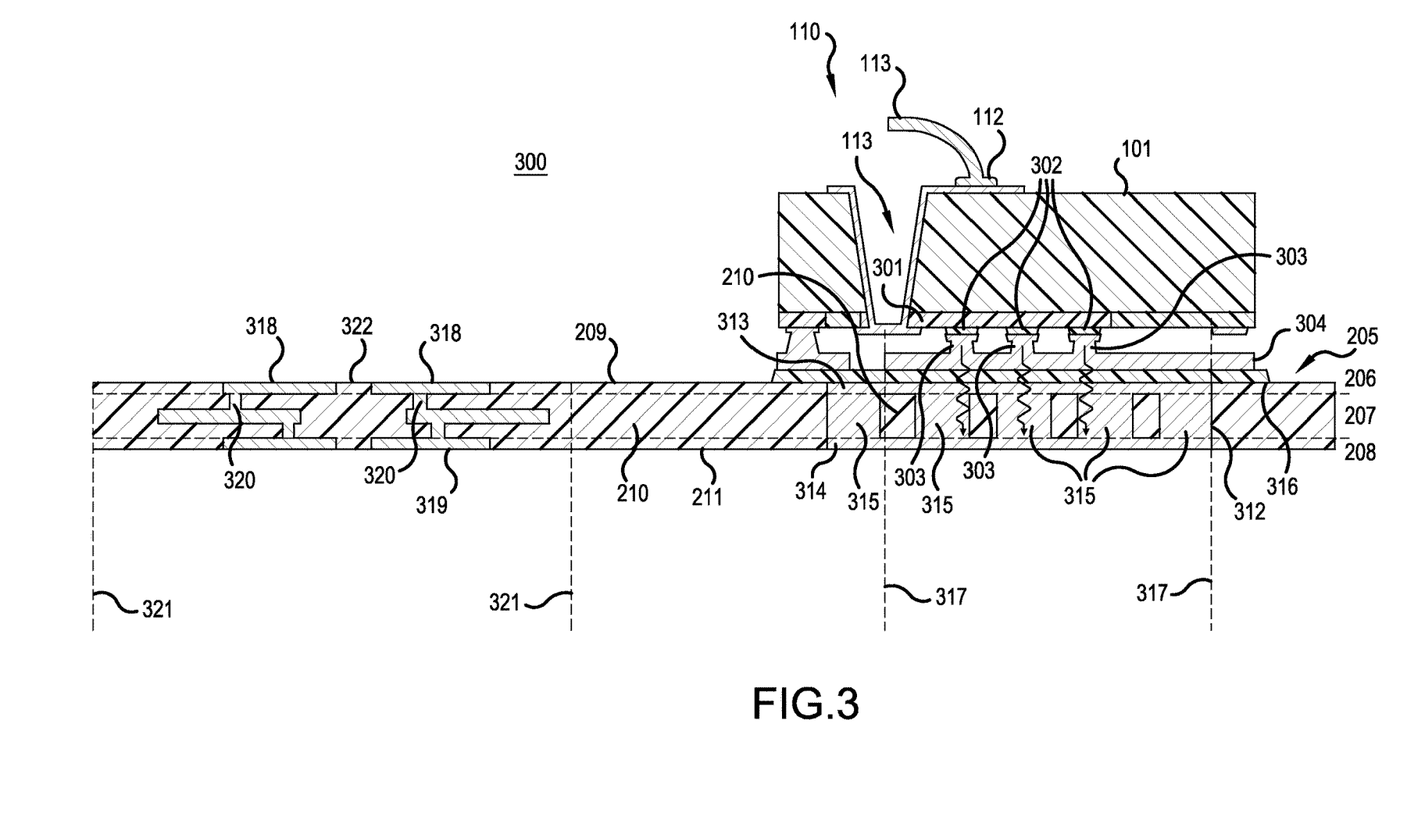
FIG. 3 shows a cross-sectional view of another portion of the semiconductor structure depicted in FIG. 1.

FIG. 3 shows a cross-sectional view taken along line 3-3 of a portion 300 of the semiconductor structure 100 depicted in FIG. 1. Many details of portion 300 are common to those described in connection with the representative embodiments described in connection with FIGS. 1~3. These details are often not repeated in order to avoid obscuring the presently described representative embodiments.

The semiconductor die substrate 101 comprises an active semiconductor region 301 disposed over a second side 101", which opposes the first side 101' of the semiconductor die substrate 101. A plurality of active semiconductor devices 302 are provided over the active semiconductor region 201, and illustratively comprise power transistors, such as may be contemplated for use in power amplifiers. The portion 300 of the semiconductor structure 100 comprises the third metalized via 111, which provides an input RF signal through the third wirebond 113 to one or more of the plurality of active semiconductor devices 302.

In a representative embodiment, each of the active semiconductor devices 302 is connected to a respective pedestal 303. Each pedestal 303 is disposed over a heat sink 304 (referred to below as a first heat sink 304), in this way, the active semiconductor devices 302 are flip-chip mounted over the heat sink 304. Notably, the heat sink 304 as illustrated is separate from first heat sink 204. However, this is merely illustrative, and the first heat sink 204 may be a continuous component, and thus, the heat sink 304 is a component of the first heat sink 204.

The heat sink 304 is disposed over the multilayer package substrate 205 that comprises the first layer 206, the second layer 207 and the third layer 208. As noted above, first layer 206 comprises the first dielectric layer 209; second layer 207 comprises the second dielectric layer 210; and third layer 208 comprises the third dielectric layer 211. Again, each of the first~third dielectric layers 209-211 may compose more than one dielectric layer.

Generally, the electrical elements (described above, for example) are electrical circuits configured to provide electrical power, electrical signals, and ground between passive components and active components (e.g., active semiconductor devices 202) disposed over the multilayer package substrate 205. Moreover, the electrical elements provided in the multilayer package substrate 205 may also provide paths of heat dissipation tot the passive and active components disposed over the multilayer package substrate 205.

A second heat sink 312 is disposed in the multilayer package substrate 205. The second heat sink 312 comprises a first electrically conductive layer 313 disposed in the first layer 206, a second electrically conductive layer 314 disposed in the third layer 208, and vias 315 disposed in the second layer 207, and connecting the first electrically conducting layer 313 to the second electrically conducting layer 314. Like the second heat sink 212, the second heat sink 312 may comprise more electrically conducting layers (not shown) disposed in additional layers (not shown) in the multilayer package substrate 205, with additional vias (not shown) connecting the additional electrically conducting layers. Moreover, there may be more or fewer vias 215 disposed between the first electrically conducting layer 313 to the second electrically conducting layer 314.

As depicted in FIG. 3, the first heat sink 304 contacts, and is bonded to the first electrically conductive layer 313 of the second heat sink 312 and overlaps the first electrically conductive layer 313 in a region 317 (referred to below as a first region 317). In the region 317, there are no "breaks" in electrically conductive material used to form the first electrically conductive layer 313, and thus the second dielectric layer 210 is not exposed at the upper surface of the multilayer package substrate 205. As such, the first heat sink 304 does not contact a dielectric material in the region 317 where the first heat sink 304 contacts and overlaps the first electrically conductive layer 313. Stated somewhat differently, the first heat sink 304 overlaps substantially all of the first electrically conductive layer 313 with only the first electrically conductive layer 313 disposed in the multilayer package substrate in a region of contact of the second heat sink 312 and the first electrically conductive layer 313. As will be described more fully below, the second heat sink 312 provides an improved path of heat dissipation (represented in FIG. 3 with "squiggly" arrows), while maintaining or exceeding the mechanical stability of the resultant semiconductor structure when compared to known structures.

In accordance with a representative embodiment, the first and second electrically conductive layers 313, 314 each comprise a material selected to provide suitable thermal conductivity, while also providing electrical conductivity. In a representative embodiment, like vias 215, the material may be a thermal electrical conductor such as gold (Au), or copper (Cu), or silver (Ag), or aluminum (Al), or Tungsten (W) or alloys thereof. Similarly, the vias 215 may comprise these materials, and generally, are made of the same materials as the first and second electrically conductive layers 313, 314. It is emphasized that this is merely illustrative and other materials may be used for the vias 315. To this end, like the vias 215, the vias 315 may comprise virtually any metal compatible with semiconductor processing, and more generally any material that provides sufficiently high thermal conductivity. Finally, in certain representative embodiments, more than one material may be used for the vias 315. For example, the outer portion of the via 315 may comprise one material (e.g., copper) that is "filled" with another material (e.g., Al) such as a damascene via structure (not shown).

Generally, an apparatus, as described herein, comprises the multilayer package substrate 205, comprising the first heat sink 304 and the second heat sink 312, with the first heat sink 304 being bonded to the second heat sink 312 using a suitable bonding material 316. By contrast, when a semiconductor die substrate (e.g., semiconductor die substrate 101) is disposed over the apparatus, the resultant structure may be referred to as a semiconductor structure. Like bonding material 216, the bonding material 316 is useful in bonding a metal or alloy layer to another layer, or a metal layer to a dielectric layer, or both. Illustratively, the bonding material 316 may be an electrically and thermally conductive material.

In a second region 321 there is substantially more dielectric material per unit volume of multilayer package substrate 205 than there is metal or other thermally and electrically conductive material. Because the thermal resistance of the dielectric material is substantially greater than metal or alloys used for the first and second electrical circuits 318, 319 and the inter-layer connections 320, heat dissipation through the second region 321 is poor compared to that in the first region 317, as described more fully below.

Furthermore, gaps (e.g., gaps 322 exist between the first electrical circuits 318 and at the upper surface of the multilayer package substrate 205, exposing the first dielectric layer 209 in a second region 321 of portion 300. If a heat sink would be disposed over the multilayer package substrate 205 to contact the first electrical circuits 318, the heat sink would be in contact with the first dielectric layer 209. These gaps 322, among other factors, would be in the heat-now path of such a heat sink and result in an increase in the thermal resistance and a decrease in the heat dissipation provided by the multilayer package substrate 205 in the second region 321 of portion 300.

Like the first region 217, the first region 317 comprises a significantly greater mass of electrically and thermally conductive material per unit volume of the multilayer package substrate 205 than that of second region 321. Specifically, this mass of electrically and thermally conductive material comprises the second heat sink 312, and may also include the first heat sink 304 disposed thereover. According to a representative embodiment, the fraction of electrically and thermally conductive material in the multilayer package substrate 205 is in the range of greater than approximately 25% to approximately 75% in the second region 321, which is the region surrounding the active semiconductor devices 302.

Certain benefits are realized by the arrangement of the second beat sink 312 disposed in the multilayer package substrate 205, and its connection to the first heat sink 304 electrically connected thereto. Illustratively, the greater density of thermally and electrically conductive material used in the first and second heat sinks 304, 312 reduce the susceptibility to stresses and strains that can occur due to mismatch of the coefficients of thermal expansion ($C_{TE}$) of materials in the first region 317. Specifically, because of the comparatively large area of overlap of the thermally and electrically conductive materials that make up the first and second heat sinks 304, 312 and in view of the comparatively small volume of other materials (e.g., first~third dielectric layers 209≡211), thermal mismatch issues due to differences in the $C_{TE}$ of materials in the first region 317 are significantly reduced compared to known structures. In accordance with a representative embodiment, the area of overlap of the electrically and thermally conductive materials that make up the first and second heat sinks 304, 312 is approximately one-half the thickness of the multilayer package substrate 205. For purposes of illustration, the area of overlap of the electrically and thermally conductive materials that make up the first and second heat sinks 304, 312 is approximately 75 μm to approximately 150 μm or more.

As such, in part because of the comparatively large area of overlap of the thermally and electrically conductive materials that make up the first and second heat sinks 304, 312, a greater amount of force can be tolerated due to thermal mismatch, providing a greater degree of mechanical isolation of the semiconductor die substrate 101 from the multilayer package substrate 205. Moreover, because of the large portion of first region 317 that is made up of thermally and electrically conductive materials that make up the first and second heat sinks 304, 312 and in view of the comparatively small volume of other materials (e.g., first~third dielectric layers 209~211), thermal mismatch is relatively small. Beneficially, because of the mechanical isolation and significantly reduced thermal mismatch realized by the first and second heat sinks 304, 312, the first region 317 in which a significant portion of heat is generated in portion 300, is less susceptible to failure due to stresses and strains that can result from these mismatches. As can be appreciated, the improved mechanical reliability directly improves the overall reliability of the semiconductor structure 100. By contrast, known discrete copper bump pillars have a comparatively small areas of overlap with the substrates over which they are disposed, and do not realize substantial mechanical isolation. As a result, their overall mechanical reliability is often not acceptable.

Additionally, because of the comparatively large portion of first region 317 that comprises a thermally and electrically conductive material, the thermal resistance in first region 317 is comparatively low. As such, thermal dissipation of heat from the active semiconductor devices 302 is substantially improved compared to known apparatuses, such as those having a copper bump pillar. As will be appreciated by one of ordinary skill in the art, for a semiconductor structure having the same areal dimensions (i.e., footprint) as semiconductor structure 100, the junction temperatures of the active semiconductor devices 302 are reduced. Similarly, for a given desired junction temperature, the semiconductor structure 100 can be provided in a smaller overall areal dimension through a smaller areal dimension of the active semiconductor region 301 and semiconductor die substrate 101, thereby allowing a lower overall cost of the semiconductor structure 100 and a smaller areal size (footprint) of the resultant package.

In addition to the improvements in thermal characteristics of the semiconductor structure 100, certain electrical properties are beneficially improved through the components of first region 317. Notably, the first and second heat sinks 304, 312 provide an electrical ground plane fabricated from electrically conductive materials, in thermal proximity to the active semiconductor devices 302, and occupying a majority of the interfacial area between the semiconductor die substrate 101 and the multilayer package substrate 205. Furthermore, compared to known power amplifier packages, because of the comparatively large areal and volume dimensions of the first and second heat sinks 304, 312, which also function as the electrical ground for the active semiconductor devices 302, the semiconductor structure 100 provides a decrease in parasitic inductance to ground. Reducing the parasitic inductance to ground can result in an efficiency improvement, and reduced power requirements, thereby improving battery life for mobile devices.

Figure 4:
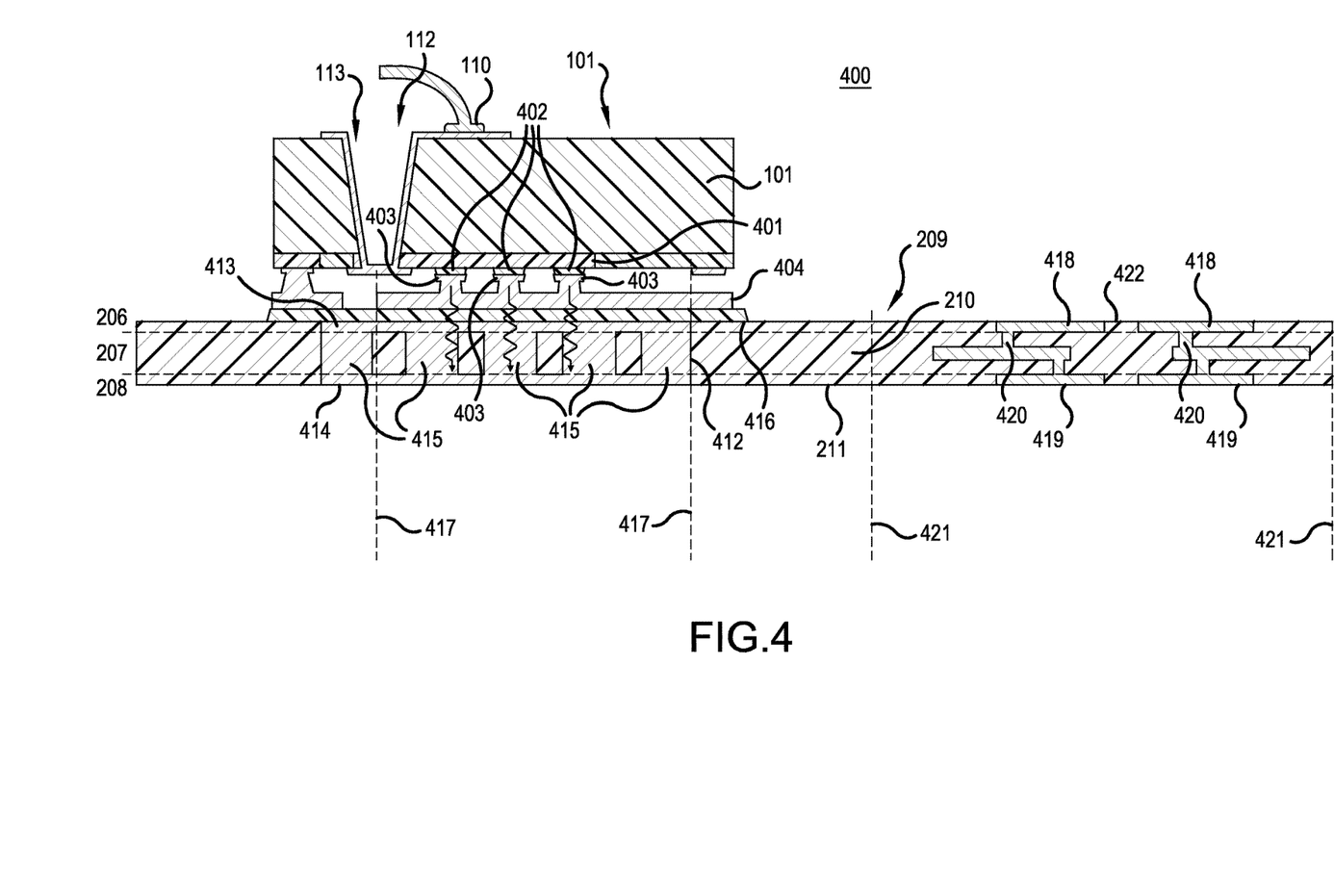
FIG. 4 shows a cross-sectional view of another portion of the semiconductor structure depicted in FIG. 1.

FIG. 4 shows a cross-sectional view taken along line 4-4 of a portion 400 of the semiconductor structure 100 depicted in FIG. 1. Many details of portion 400 are common to those described in connection with the representative embodiments described in connection with FIGS. 1-3. These details are often not repeated in order to avoid obscuring the presently described representative embodiments.

The semiconductor die substrate 101 comprises an active semiconductor region 401 disposed over a second side 101", which opposes the first side 101' of the semiconductor die substrate 101. A plurality of active semiconductor devices 402 are provided over the active semiconductor region 401, and illustratively comprise power transistors, such as may be contemplated for use in power amplifiers. The portion 400 of the semiconductor structure 100 comprises the third metalized via 111, which provides an input RF signal through the third wirebond 113 to one or more of the plurality of active semiconductor devices 402.

In a representative embodiment, each of the active semiconductor devices 402 is connected to a respective pedestal 403. Each pedestal 403 is disposed over a heat sink 404 (referred to below as a first heat sink 404). In this way, the active semiconductor devices 402 are flip-chip mounted over the heat sink 404. Notably, the heat sink 404 as illustrated is separate from heat sink 404. However, this is merely illustrative, and the first heat sink 204 may be a continuous component, and thus, the heat sink 404 is a component of the first heat sink 204.

The heat sink 404 is disposed over the multilayer package substrate 205 that comprises the first layer 206, the second layer 207 and the third layer 208. As noted above, first layer 206 comprises the first dielectric layer 209; second layer 207 comprises the second dielectric layer 210; and third layer 208 comprises the third dielectric layer 211. Again, each of the first~third dielectric layers 209-211 may comprise more than one dielectric layer.

Generally, the electrical elements (described above, for example) are electrical circuits configured to provide electrical power, electrical signals, and ground between passive components and active components (e.g., active semiconductor devices 202) disposed over the multilayer package substrate 205. Moreover, the electrical elements provided in the multilayer package substrate 205 may also provide paths of heat dissipation for the passive and active components disposed over the multilayer package substrate 205.

A second heat sink 412 is disposed in the multilayer package substrate 205. The second heat sink 412 comprises a first electrically conductive layer 413 disposed in the first layer 206, a second electrically conductive layer 414 disposed in the third layer 208, and vias 415 disposed in the second layer 207, and electrically connecting the first electrically conducting layer 413 to the second electrically conducting layer 414. Like the second heat sink 212, the second heat sink 412 may comprise more electrically conducting layers (not shown) disposed in additional layers (not shown) in the multilayer package substrate 205, with additional vials (not shown) connecting the additional electrically conducting layers. Moreover, there may be more or fewer vias 215 disposed between the first electrically conducting layer 413 and the second electrically conducting layer 414.

As depicted in FIG. 4, the first heat sink 404 contacts, and is bonded to the first electrically conductive layer 413 of the second heat sink 412 and overlaps the first electrically conductive layer 413 in a region 417 (referred to below as a first region 417). In the region 417, there are no "breaks" in electrically conductive material used to form the first electrically conductive layer 413, and thus the second dielectric layer 210 is not exposed at the upper surface of the multilayer package substrate 205. In such, the first heat sink 404 does not contact a dielectric material in the region 417 where the first heat sink 404 contacts and overlaps the first electrically conductive layer 413. Stated somewhat differently, the first heat sink 404 overlaps substantially all of the first electrically conductive layer 413 with only the first electrically conductive layer 413 disposed in the multilayer package substrate 205 in a region of contact of the second heat sink 412 and the first electrically conductive layer 413. As will be described more fully below, the second heat sink 412 provides an improved path of heat dissipation (represented in FIG. 4 with "squiggly" arrows), while maintaining or exceeding the mechanical stability of the resultant semiconductor structure when compared to known structures.

In accordance with a representative embodiment, the first and second electrically conductive layers 413, 414 each comprise a material selected to provide suitable thermal conductivity, while also providing electrical conductivity. In a representative embodiment, like vias 215, the material may be a thermal electrical conductor such as gold (Au), or copper (Cu), or silver (Ag), or aluminum (Al), or Tungsten (W) or alloys thereof. Similarly, the vias 415 may comprise these materials, and generally, are made of the same materials as the first and second electrically conductive layers 413, 414. It is emphasized that this is merely illustrative and other materials may be used liar the vias 415. To this end, like the vias 215, the vias 415 may comprise virtually any metal compatible with semiconductor processing, and more generally any material that provides sufficiently high thermal conductivity. Finally, in certain representative embodiments, more than one material may be used for the vias 415. For example, the outer portion of the vias 415 may comprise one material (e.g., copper) that is "filled" with another material (e.g., Al) such as a damascene via structure (not shown).

Generally, an apparatus, as described herein, comprises the multilayer package substrate 205, comprising the first heat sink 404 and the second heat sink 412, with the first heat sink 404 being bonded to the second heat sink 412 using a suitable bonding material 416. By contrast, when a semiconductor die substrate (e.g., semiconductor die substrate 101) is disposed over the apparatus, the resultant structure may be referred to as a semiconductor structure. Like bonding material 216, the bonding material 416 is useful in bonding a metal or alloy layer to another layer, or a metal layer to a dielectric layer, or both. Illustratively, the bonding material 416 may be an electrically and thermally conductive material.

In a second region 421 there is substantially more dielectric material per unit volume of multilayer package substrate 205 than there is metal or other thermally and electrically conductive material. Because the thermal resistance of the dielectric material is substantially greater than metal or alloys used for the first and second electrical circuits 418, 419 and the inter-layer connections 420, heat dissipation through the second region 421 is poor compared to that in a first region 417 (referred to below as first region 417), as described more fully below.

Furthermore, and as noted above, gaps (e.g., gaps 422) exist between the first electrical circuits 418 and at the upper surface of the multilayer package substrate 205, exposing the first dielectric layer 209 in a second region 421 of portion 400. If a heat sink would be disposed over the multilayer package substrate 205 to contact the first electrical circuits 418, the heat sink would be in contact with the first dielectric layer 209. These gaps 422, among other factors would be in the heat-flow path of such a heat sink and result in an increase in the thermal resistance and a decrease in the heat dissipation provided by the multilayer package substrate 205 in the second region 421 of portion 400.

By contrast, and as noted above, in first region 417, no gaps or breaks exist exposing dielectric material at the surface of multilayer package substrate 205, and the first heat sink 404 does not contact a dielectric material in the first region 417 where the first heat sink 404 contacts and overlaps the first electrically conductive layer 413. As such, the thermal path for heat dissipation (represented by "squiggly" lines in FIG. 4) is through the first and second heat sinks 404, 412, with little, if arty dielectric material in the thermal path. Thus, and as depicted in FIG. 4, the first heat sink 404 contacts, and is bonded to the first electrically conductive layer 413 of the second heat sink 412 and overlaps the first electrically conductive layer 413 in the first region 417. Stated somewhat differently, the first heat sink 404 overlaps substantially all of the first electrically conductive layer 413 with only the first electrically conductive layer 413 disposed in the multilayer package substrate in a region of contact of the second heat sink 412 and the first electrically conductive layer 413. Beneficially, the second heat sink 412 provides an improved path of heat dissipation, while maintaining or exceeding the mechanical stability of the resultant semiconductor structure when compared to known structures.

Notably, like the first region 217, the first region 417 comprises significantly greater mass of electrically and thermally conductive material per unit volume of the multilayer package substrate 205 than that of second region 421. Specifically, this mass of electrically and thermally conductive material comprises the second heat sink 412, and may also include the first heat sink 404 disposed thereover. According to a representative embodiment, the fraction of electrically and thermally conductive material in the multilayer package substrate 205 is in the range of greater than approximately 25% to approximately 75% in the second region 421, which is the region surrounding the active semiconductor devices 402.

Certain benefits are realized by the arrangement of the second heat sink 412 disposed in the multilayer package substrate 205, and its connection to the first heat sink 204 electrically connected thereto. Illustratively, the greater density of thermally and electrically conductive material used in the first and second heat sinks 404, 412 reduces the susceptibility to stresses and strains that can occur due to mismatch of the coefficients of thermal expansion ($C_{TE}$) of materials in the first region 417. Specifically, because of the comparatively large area of overlap of the thermally and electrically conductive materials that make up the first and second heat sinks 404, 412 and in view of the comparatively small volume of other materials (e.g., first~third dielectric layers 209~211), thermal mismatch issues due to differences in the $C_{TE}$ of materials in the first region 417 are significantly reduced compared to known structures. In accordance with a representative embodiment, the area of overlap of the electrically and thermally conductive materials that make up the first and second heat sinks 404, 412 is approximately one-half the thickness of the multilayer package substrate 205. For purposes of illustration, the area of overlap of the electrically and thermally conductive materials that make up the first and second heat sinks 404, 412 is approximately 75 μm to approximately 150 μm or more.

As such, in part because of the comparatively large area of overlap of the thermally and electrically conductive materials that make up the first and second heat sinks 404, 412, a greater amount of force can be tolerated due to thermal mismatch, providing a greater degree of mechanical isolation of the semiconductor die substrate 101 from the multilayer package substrate 205. Moreover, because of the large portion of first region 417 that is made up of thermally and electrically conductive materials that make up the first and second heat sinks 404, 412 and in view of the comparatively small volume of other materials (e.g., first~third dielectric layers 09~211), thermal mismatch is relatively small. Beneficially, because of the mechanical isolation and significantly reduced thermal mismatch realized by the first and second heat sinks 404, 412, the first region 417 in which a significant portion of heat is generated, is less susceptible to failure due to stresses and strains that can result from these mismatches. As can be appreciated, the improved mechanical reliability directly improves the overall reliability of the semiconductor structure 100. By contrast, known discrete copper bump pillars have a comparatively small areas of overlap with the substrates over which they are disposed, and do not realize substantial mechanical isolation. As a result, their overall mechanical reliability is often not acceptable.

Additionally, because of the comparatively large portion of first region 417 that comprises a thermally and electrically conductive material, the thermal resistance in the first region 417 is comparatively low. As such, thermal dissipation of heat from the active semiconductor devices 402 is substantially improved compared to known apparatuses, such as those having a copper bump pillar. As will be appreciated by one of ordinary skill in the art, for a semiconductor structure having the same areal dimensions (i.e., footprint) as semiconductor structure 100, the junction temperatures of the active semiconductor devices 402 are reduced. Similarly, for a given desired junction temperature, the semiconductor structure 100 can be provided in a smaller overall areal dimension through a smaller areal dimension of the active semiconductor region 401 and semiconductor die substrate 101, thereby allowing a lower overall cost of the semiconductor structure 100 and a smaller areal size (footprint) of the resultant package.

In addition to the improvements in thermal characteristics of the semiconductor structure 100, certain electrical properties are beneficially improved through the components of first region 417. Notably, the first and second heat sinks provide an electrical ground plane fabricated from electrically conductive materials, in thermal proximity to the active semiconductor devices 402, and occupying a majority of the interfacial area between the semiconductor die substrate 101 and the multilayer package substrate 205. Furthermore, compared to known power amplifier packages, because of the comparatively large areal and volume dimensions of the first and second heat sinks 404, 412, which also function as the electrical ground for the active semiconductor devices 402, the semiconductor structure 100 provides a decrease in parasitic inductance to ground. Reducing the parasitic inductance to ground can result in an efficiency improvement, and reduced power requirements, thereby improving battery life for mobile devices.

In view of this disclosure it is noted that the various semiconductor structures and apparatuses can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

What is claimed:

1. An apparatus, comprising:
a first heat sink comprising: a first side and a second side, the entire first side being disposed over an upper surface of a multilayer package substrate, and the second side comprising a plurality of electrically conductive pedestals disposed thereon, the first heat sink being configured to connect to a plurality of semiconductor devices and to provide an electrical ground for the semiconductor devices, wherein each of the electrically conductive pedestals is configured to connect to one of the semiconductor devices, the multilayer package substrate comprising: at least one dielectric layer having the upper surface; a second heat sink comprising a first electrically conductive layer disposed in a first layer; a second electrically conductive layer disposed in a third layer; and a via disposed in a second layer, the via electrically connecting the first electrically conductive layer and the second electrically conductive layer.

2. The apparatus as claimed in claim 1, wherein the via is one of a plurality of vias electrically connecting the first electrically conductive layer and the second electrically conductive layer.

3. The apparatus as claimed in claim 2, wherein the second heat sink occupies more than approximately 25% of the volume of the multilayer package substrate in a region near the semiconductor devices.

4. The apparatus as claimed in claim 1, wherein the second heat sink is disposed in a region near the semiconductor devices, wherein a wirebond is adapted to form an electrical connection between each of the semiconductor devices and an electrical circuit of the multilayer package substrate, the wirebond being configured to transmit either an electrical signal or electrical power to the semiconductor devices.

5. The apparatus as claimed in claim 1, wherein the second heat sink substantially occupies a majority of an interfacial area between the semiconductor devices and the multilayer package substrate.

6. The apparatus as claimed in claim 5, wherein the semiconductor devices comprises a power amplifier comprising semiconductor substrate, the semiconductor substrate comprising one or more of gallium arsenide (GaAs), indium phosphide (InP), aluminum arsenide (AlAs), or alloys of GaAs, InP, AlAs.

7. The apparatus as claimed in claim 6, wherein each of the semiconductor devices comprises one or more of a metal-semiconductor field effect transistor (MESFET), a high electron mobility transistor (HEMT), a pseudomorphic HEMT, a junction field effect transistor (JFET), and a heterojunction bipolar transistor (HBT).

8. The apparatus as claimed in claim 1, wherein each of the electrically conductive pedestals is a damascene structure comprising a first electrically conductive material that is filled with a second electrically conductive material.

9. The apparatus as claimed in claim 8, wherein at least one of the semiconductor devices comprises an active device.

10. The apparatus as claimed in claim 1, further comprising an electrically conductive bonding material that is disposed directly on an upper surface of a multilayer package substrate, wherein the first heat sink is disposed directly on the electrically conductive bonding material, which is disposed directly on the upper surface.

11. A semiconductor structure, comprising:
a semiconductor substrate comprising a first side and a second side;
a plurality of semiconductor device disposed over the second side of the semiconductor substrate; and
a first heat sink comprising: a first side and a second side, the entire first side being disposed over an upper surface of a multilayer package substrate, and the second side comprising a plurality of electrically conductive pedestals disposed thereon, the first heat sink being configured to connect to a plurality of semiconductor devices and to provide an electrical ground for the semiconductor devices, wherein each of the electrically conductive pedestals is configured to connect to one of the semiconductor devices, the multilayer package substrate comprising: at least one dielectric layer having the upper surface: a second heat sink comprising a first electrically conductive layer disposed in a first layer; a second electrically conductive layer disposed in a third layer; and a via disposed in a second layer, the via electrically connecting the first electrically conductive layer and the second electrically conductive layer, wherein the first heat sink overlaps substantially all of the first electrically conductive layer with only the first electrically conductive layer disposed in the multilayer package substrate in a region of contact of the second heat sink and the first electrically conductive layer.

12. The semiconductor structure as claimed in claim 11, wherein the via is one of a plurality of vias electrically connecting the first electrically conductive layer and the second electrically conductive layer.

13. The semiconductor structure as claimed in claim 11, further comprising:
a wirebond pad disposed over the first side of the semiconductor substrate;
a via electrically connected to the wirebond pad, and to the semiconductor devices, the via extending through a semiconductor substrate and between the first and second sides of the semiconductor substrate.

14. The semiconductor structure as claimed in claim 13, wherein the wirebond pad is a first wirebond pad and the via is a first via, and the semiconductor structure further comprises:
- a second wirebond pad disposed over the first side of the semiconductor substrate; and
- a second via electrically connected to the second wirebond pad, and to the semiconductor devices, the second via extending through the semiconductor substrate and between the first and second sides of the semiconductor substrate.

15. The semiconductor structure as claimed in claim 14, wherein the wirebond pad is connected to a first wirebond configured to transmit electrical signals to and to receive electrical signals from the semiconductor devices.

16. The semiconductor structure as claimed in claim 15, wherein the wirebond pad is connected to a second wirebond configured to transmit electrical power to the semiconductor devices.

17. The semiconductor structure as claimed in claim 11, wherein the second heat sink is disposed in a region near the semiconductor devices, the second heat sink comprising an electrically conductive material.

18. The semiconductor structure as claimed in claim 17, wherein the electrically conductive material of the second heat sink occupies more than approximately 25% of the volume of the multilayer package substrate in the region near the semiconductor devices.

19. The semiconductor structure as claimed in claim 11, wherein the second heat sink substantially occupies a majority of an interfacial area between the semiconductor devices and the multilayer package substrate, which is thermally conductive.

20. The semiconductor structure as claimed in claim 11, wherein each of the electrically conductive pedestals is a damascene structure comprising a first electrically conductive material that is filled with a second electrically conductive material.

21. The semiconductor structure as claimed in claim 20, wherein the semiconductor substrate comprises a power amplifier comprising the semiconductor devices, the semiconductor substrate comprising one or more of gallium arsenide (GaAs), indium phosphide (InP), aluminum arsenide (AlAs), or alloys of GaAs, InP, AlAs.

22. The semiconductor structure as claimed in claim 21, wherein at least one of the semiconductor devices comprises an active device.

23. The semiconductor structure as claimed in claim 22, wherein the active device comprises one or more of a metal-semiconductor field effect transistor (MESFET), a high electron mobility transistor (HEMT), a pseudomorphic HEMT, a junction field effect transistor (JFET), and a heterojunction bipolar transistor (HBT).

24. The semiconductor structure as claimed in claim 11, further comprising an electrically conductive bonding material that is disposed directly on an upper surface of a multilayer package substrate, wherein the first heat sink is disposed directly on the electrically conductive bonding material, which is disposed directly on the upper surface.

* * * * *